United States Patent [19]

Schuetz

[11] Patent Number: 5,019,461

[45] Date of Patent: May 28, 1991

[54] RESISTIVE OVERLAYER FOR THIN FILM DEVICES

[75] Inventor: James A. Schuetz, Maple Grove, Minn.

[73] Assignee: Honeywell Inc., Minneapolis, Minn.

[21] Appl. No.: 939,316

[22] Filed: Dec. 8, 1986

[51] Int. Cl.$^5$ .................. B32B 15/04; H01L 27/12
[52] U.S. Cl. ................... 428/688; 428/662; 428/668; 428/678; 428/680; 428/681; 428/689; 428/660; 428/692; 428/694; 428/693; 428/698; 428/699; 357/4; 357/23.7
[58] Field of Search ............ 428/660, 662, 668, 678, 428/681, 680, 688, 689, 692, 693, 694, 698, 699; 357/4, 23.7

[56] References Cited

U.S. PATENT DOCUMENTS

| | | |
|---|---|---|
| 3,015,807 | 10/1957 | Pohm et al. |
| 3,125,743 | 3/1958 | Pohm et al. |
| 3,375,503 | 9/1963 | Bertelsen . |
| 3,382,053 | 5/1968 | Altman et al. ............... 428/662 |
| 3,452,334 | 12/1964 | Voegeli . |
| 3,466,632 | 12/1966 | Wang . |
| 3,484,756 | 5/1964 | Voegeli . |
| 3,524,173 | 5/1967 | Wolf . |
| 3,525,023 | 8/1965 | Pollack . |
| 3,587,069 | 11/1969 | Goto . |
| 3,617,816 | 11/1971 | Riseman ............... 357/71 |
| 3,623,038 | 12/1969 | Franklin et al. |
| 3,701,931 | 10/1972 | Revitz et al. ............ 428/641 |
| 3,701,983 | 10/1972 | Franklin et al. |
| 3,723,838 | 3/1973 | Kumagai ............... 361/305 |
| 3,825,802 | 7/1974 | Kumagai et al. ........... 361/433 |
| 3,847,658 | 11/1974 | Kumagai ............... 361/305 |
| 3,996,575 | 12/1976 | Battarel . |
| 4,000,055 | 12/1976 | Kumagai ............... 204/192.15 |
| 4,079,360 | 3/1978 | Ookubo et al. |
| 4,097,802 | 6/1978 | Mahopac . |
| 4,208,725 | 6/1980 | Paul et al. |
| 4,307,132 | 12/1981 | Chu et al. ............ 204/192.15 |
| 4,364,099 | 12/1982 | Koyama et al. ............ 361/322 |
| 4,447,825 | 5/1984 | Oana et al. ............... 357/65 |

OTHER PUBLICATIONS

J. M. Daughton et al., IBM Technical Disclosure Bulletin, vol. 8, No. 11, Apr. 1966, pp. 1613-1614.
J. Berchier et al., Magnetoresistive Switching of Small Permalloy Sandwich Structures, J. Appl. Phys., vol. 55, No. 2, 15 Jan. 1984, pp. 487-492.
Ooyen et al., Magnetoresistance in Laminated Fife films, J. Appl. Phys. 53(3), Mar. 1982—pp. 2596-2598.
Ahn et al., Fabrication of Contiguoud-Disk Magnetic Bubble Devices, IEEE Transactions on Magnetis, vol. MAG-15, No. 1, Jan. 1980.

Primary Examiner—George F. Lesmes
Assistant Examiner—Elizabeth M. Cole
Attorney, Agent, or Firm—G. A. Bruns

[57] ABSTRACT

A thin film, solid state device includes a conductive thin film formed on a substrate, with a resistive layer overlying the conductive thin film and with electrical contacts formed on the upper surface of the resistive layer. Electrical current flows between the electrical contacts through the resistive overlayer and the conductive thin film. The resistivity and dimensions of the resistive layer are such that, preferably, only a small fraction of any current flowing between the electrical contacts will flow solely within the resistive layer, yet the magnitude of the current will not be reduced below a desired signal level due to the presence of the resistive layer. The resistive layer is comprised of material which will not diffuse into the thin film conductive layer during device processing. Nitrogen doped tantalum is the preferred material for the resistive layer. A compound or mixture of a metal and either nitrogen or oxygen, where the compound or mixture will not diffuse into the thin film conductive layer, is also a useful material for the resistive layer.

8 Claims, 1 Drawing Sheet

RESISTIVE OVERLAYER FOR THIN FILM DEVICES

BACKGROUND OF THE INVENTION

Reference is hereby made to a copending application by J.A. Schuetz entitled "Resistive Overlayer for Magnetic Films" having Ser. No. 939,315, filed Dec. 8, 1986, now U.S. Pat. No. 4,857,418.

1. Field of the Invention

This invention relates to thin film devices and particularly sensors wherein a protective, resistive layer overlies at least part of a thin film conductive layer, and wherein the resistive layer is interposed between the conductive layer and an electrical contact.

2. Related Art

Certain solid state thin film devices have a conductive thin film formed directly on a substrate or formed as the top layer of a plurality of thin film layers stacked on the substrate. The thin film device operates in response to or relies upon current flowing through the conductive film. Current levels are often very small, e.g. a few milliamps. Current is supplied to the conductive film through electrical contacts formed on its surface.

Often it is a requirement that the electrical contact layer pass over the conductive thin film without making contact. Therefore an insulation layer is formed between the two. The insulating layer is usually masked and etched to define device features and provide pathways to the thin conductive film. Exposure of the conductive thin film to corrosive or even normal atmosphere during processing will result in a thin oxide layer or other highly resistive layer on the thin film's upper surface. This thin oxide layer will alter the electrical characteristics of electrical contact sites on the thin film in undesirable and often unpredictable ways. Further, since the conductive film is typically less than 1000Å thick, and for many applications is less than 100Å thick, it is difficult to control the etching of the insulating layer with enough precision to avoid cutting deeply into the conductive layer or even etching through it. Deep cuts in the conductive film can adversely affect current flow therein and device performance.

Protective layers overlying the conductive film could be employed, but if the protective layer is a good conductor, it could short out the electrical properties of the conductive film and reduce the already low signal current levels in the film.

Further, protective layers of a semiconductor material often diffuse into most conductive films during processing, thus adversely affecting the electrical and possibly even the mechanical properties of the conductive film.

Thus, a conductive thin film solid state device, wherein the thin film is protected during processing by a material which will not diffuse into the thin film, yet not adversely affect the electrical properties of the thin film device, is highly desirable and heretofore undisclosed.

SUMMARY OF THE INVENTION

The present invention is a thin film, solid state device wherein a conductive thin film is formed either directly on a substrate or is separated from the substrate by one or more intermediate layers, and the thin film is covered by a resistive layer. The resistive layer protects the conductive thin film during device processing, yet its resistivity and dimensions are selected so that the magnitude of current flowing in the device will not be reduced below a desired level and so that less than half of the current will flow through the device solely within the resistive layer.

Electrical contacts are formed at, at least, two locations on the upper surface of the resistive layer.

A particularly useful material for the resistive layer is nitrogen doped tantalum. Mixtures of a metal and nitrogen or oxygen, where the mixture does not diffuse into the conductive film during processing, are also very useful.

DESCRIPTION OF THE PREFERRED EMBODIMENT

Figure 1:
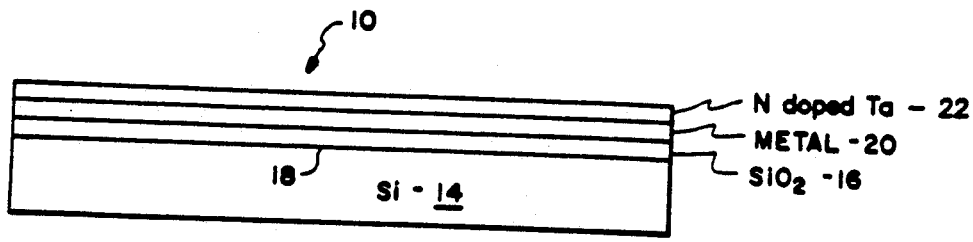
FIG. 1 is a sectional view of an intermediate solid state product which employs the present invention, and which is ready for etching.

FIG. 1 depicts an intermediate product 10 of a generalized conductive thin film, solid state device 12 (see FIG. 3) during processing. Product 10 includes a substrate 14, an insulating layer 16 formed on the upper principal surface 18 of substrate 14, an electrically conductive thin film 20 overlying layer 16, and a resistive layer 22 overlying conductive film 20.

Figure 2:
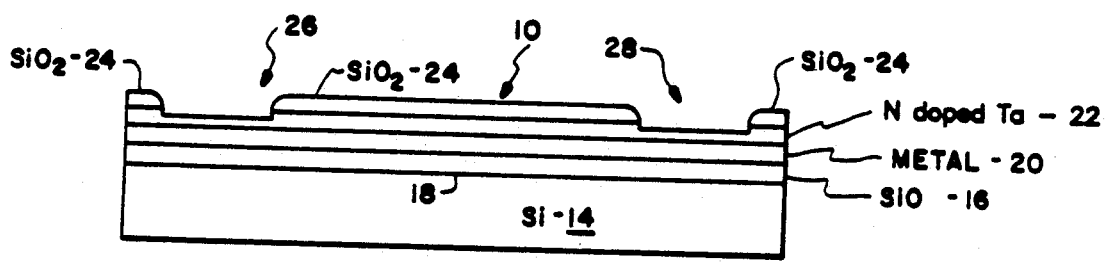
FIG. 2 is the intermediate product of FIG. 1 after etching.

FIG. 2 depicts product 10 after an insulating layer 24 has been deposited on resistive layer 22, and layer 24 patterned and etched to expose selected sites (26 and 28) on resistive layer 22.

Figure 3:
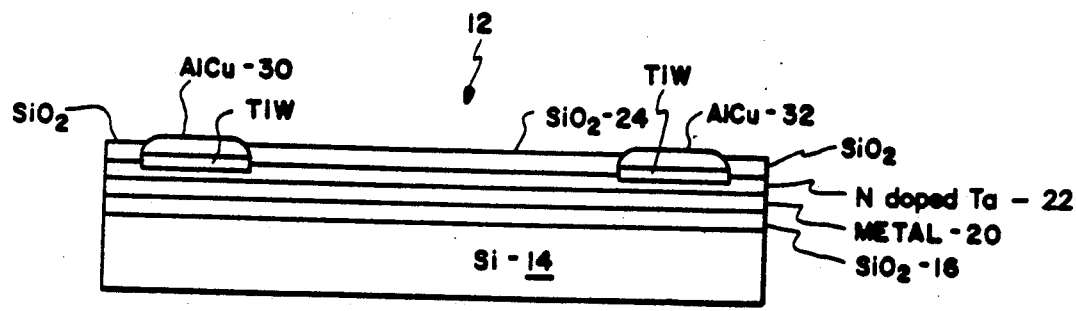
FIG. 3 is a completed solid state device with electrical contacts added to the product of FIG. 2.

FIG. 3 shows the completed thin film device 12, with electrical contacts 30 and 32 formed at sites 26 and 28, respectively.

In operation, current will flow through device 12 from contact 30 to contact 32. The presence of resistive layer 22 will increase the contact resistance and decrease the line resistance of device 12 as compared to a device without layer 22.

The line resistance $R_1$ of resistive layer 22 is given by:

$$R_1 = \frac{\rho \times L}{T \times W},$$

where
$\rho$ = bulk resistivity of the material
$t$ = the thickness of the layer,
$L$ = length of the layer between vias, and
$W$ = width of the film.

The contact resistance $R_c$ is the resistance between a conductive contact and conductive thin film 20 due to the presence of resistive layer 22. It can be determined per contact or per square unit of via area. $R_c$/contact is given by:

$$R_c = \frac{\rho \times t}{L \times W},$$

where

ρ and t are defined as above,
L = length of the via, and
W = width of the via.

Increased contact resistance in device 12 will reduce the current flowing in the device. The larger the line resistance of layer 22, the more current will flow between contacts 30 and 32 through conductive film 20 rather than resistive layer 22. For many solid state devices, it is important to have the majority if not nearly all of the current flowing within conductive film 20.

The resistances associated with the upper layers of device 12 can be viewed as the contact resistance of resistive layer 22 in series with the parallel combination of the line resistance of layer 22 and the line resistance of conductive film (or films) 20.

Generally, the current levels in device 12 will be small. Therefore the increase in contact resistance of device 12 due to the presence of resistive layer 22, and the resulting decrease in current, should be carefully controlled.

The dimensions and resistivity of layer 22 should be selected so that the current flowing in conductive film 20 will remain above desired signal levels. The choices of dimensions, resistivities and signal levels are highly application dependent. For some applications the magnitude of the current could be reduced by up to 50 percent, although generally current reduction on the order of one percent is preferable.

Resistive layer 22 is a material which will generally afford a higher line resistance than the line resistance of the underlying conductive film 20. It is also important that resistive layer 22 does not diffuse into conductive film 20 during processing. If layer 22 diffused into conductive film 20, the electrical characteristics of film 20 could be substantially adversely affected.

A transition metal from the periodic table (or alloy thereof), which does not diffuse into layer 20, is stable, and affords the desired resistances, is a suitable material. Further, a compound or mixture of a metal and either nitrogen or oxygen, which will not diffuse into film 20, is a good selection as layer 22, because the resistivity can be tailored by adjusting the amount of oxygen or nitrogen.

Nitrogen doped tantalum, Nitrogen doped tantalum is a particularly useful material as resistive layer 22. The amount of nitrogen can be adjusted to tailor the resistivity for the particular application. For example preferably the tantalum will be doped with enough nitrogen so that 15 to 35 percent, by atomic concentration, of the nitrogen doped tantalum is nitrogen.

Electrical contacts 30 and 32 are typically comprised of a good electrical conductor (such as AlCu) and a barrier metal (such as TiW) to prevent diffusion of the Al.

Figure 4:
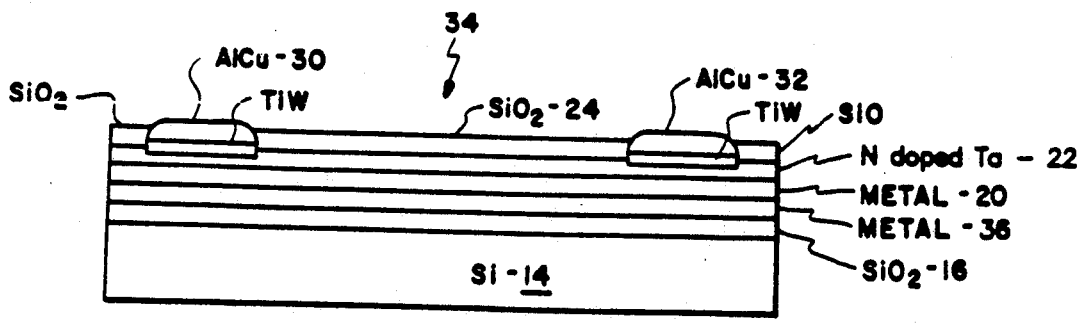
FIG. 4 is a sectional view of another solid state thin film device wherein a resistive layer protects multiple underlying layers.

FIG. 4 shows another solid state device 34, wherein the present invention is particularly useful. Corresponding structure in devices 12 and 34 are like numbered. Device 34 differs from device 12 only in that multiple layers between the substrate and the resistive overlayer 22 are explicitly depicted. The additional layer 36 is typically another conductive thin film, but it may even be a resistive layer similar to layer 22. Of course, further additional layers such as layer 36 could be interposed between layer 36 and insulating layer 16.

An additional insulating layer (not shown) may overlie layer 16. The thickness of these various layers is again highly application dependent, typically ranging from 100 to several thousand angstroms.

As shown in FIG. 2, insulating layer 24 has been patterned and etched to form contact sites 26 and 28 on resistive layer 22. Note that the thickness of resistive layer 22 at contact sites 26 and 28 is reduced due to the etching process. Although the thickness of layer 22 is reduced, conductive thin film layer 20 has not been exposed nor cut into. Thus resistive layer 22 has served to protect conductive thin film 20 during processing, and the presence of resistive layer 22 will not adversely affect the electrical characteristics of the solid state device 12.

A typical metal employed as thin film layer 20 is permalloy (e.g. 65% Ni, 15% Fe and 20% Co), and $TaN_x$ adheres well to permalloy.

What is claimed is:

1. A thin film solid state device, wherein electrical current can flow through said device from a first to a second location, said device comprising:
    a semiconductor substrate having a principal surface;
    an insulating material on said principal surface;
    an electrically conductive thin film material overlying said insulating material;
    a resistive material overlying, at least in part, and being in contact with, said conductive thin film material, wherein said first and said second locations are on a surface of said resistive material, said surface of said resistive material being oppositely disposed from said conductive thin film material, wherein said resistive layer will not diffuse into said conductive thin film conductive material, and wherein said conductive thin film material; and said resistive material each are continuous between said first and said second locations; and
    electrical contacts at said first and said second locations, wherein the resistivity and dimensions of said resistive material and of said locations are such that less than half of said current will flow solely within said resistive material in passing between said first and said second locations through said contacts, and such that magnitude of said current will remain above a desired level.

2. The device of claim 1 wherein said resistive layer includes a metal and either nitrogen or oxygen.

3. The device of claim 1 wherein said resistive layer includes tantalum and nitrogen.

4. The device of claim 1 wherein approximately one percent of said current will flow solely within said resistive layer in passing between said first and said second location, and wherein the magnitude of said current will be reduced by approximately one percent due to the presence of said resistive layer.

5. The device of claim 1 wherein said resistive layer includes nitrogen doped tantalum.

6. The device of claim 1 wherein said electrical contacts are comprised of metal.

7. The device of claim 1 further including additional resistive material interposed between said insulating material and said conductive thin film material.

8. The device of claim 1 wherein said conductive thin film material and said resistive material each form a single thin film layer.

* * * * *